(12) United States Patent
Zhang et al.

(10) Patent No.: US 8,268,141 B2
(45) Date of Patent: Sep. 18, 2012

(54) HIGH-STRENGTH SPUTTERING TARGET FOR FORMING PROTECTIVE FILM FOR OPTICAL RECORDING MEDIUM

(75) Inventors: Shoubin Zhang, Sanda (JP); Hayato Sasaki, Ryugasaki (JP); Shozo Komiyama, Sanda (JP); Akifumi Mishima, Saitama (JP)

(73) Assignee: Mitsubishi Materials Corporation, Tokyo (JP)

( * ) Notice: Subject to any disclaimer, the term of this patent is extended or adjusted under 35 U.S.C. 154(b) by 814 days.

(21) Appl. No.: 12/303,590

(22) PCT Filed: Jun. 8, 2007

(86) PCT No.: PCT/JP2007/061643
§ 371 (c)(1),
(2), (4) Date: Dec. 5, 2008

(87) PCT Pub. No.: WO2007/142333
PCT Pub. Date: Dec. 13, 2007

(65) Prior Publication Data
US 2010/0170785 A1      Jul. 8, 2010

(30) Foreign Application Priority Data
Jun. 8, 2006 (JP) ................. 2006-159303

(51) Int. Cl.
*C23C 14/34* (2006.01)
*C01B 33/20* (2006.01)
*C01B 33/46* (2006.01)

(52) U.S. Cl. ............. 204/298.13; 423/326; 423/594.12; 423/624; 264/122

(58) Field of Classification Search ........................ None
See application file for complete search history.

(56) References Cited

U.S. PATENT DOCUMENTS

| 5,514,485 A * | 5/1996 | Ando et al. .................. 428/702 |
| RE39,120 E * | 6/2006 | Sechi et al. ....................... 501/9 |
| 2004/0231981 A1* | 11/2004 | Takahashi et al. ....... 204/298.13 |
| 2005/0019695 A1 | 1/2005 | Kojima et al. |

FOREIGN PATENT DOCUMENTS

| EP | 1 757 712 A1 | 2/2007 |
| JP | 2004-175625 A | 6/2004 |
| JP | 2005-056545 A | 3/2005 |
| JP | 2005171315 A * | 6/2005 |
| JP | 2005-251237 A | 9/2005 |
| JP | 2005-330158 A | 12/2005 |
| WO | WO-2005/083150 A1 | 9/2005 |
| WO | WO-2005/121393 A1 | 12/2005 |

OTHER PUBLICATIONS

Mishima, A. et al.; JP-2005171315-A; Jun. 2005; Derwent abstract, JPO English abstract, and machine translation.*

* cited by examiner

*Primary Examiner* — Krishnan S Menon
*Assistant Examiner* — Michelle Adams
(74) *Attorney, Agent, or Firm* — Leason Ellis LLP.

(57) ABSTRACT

A high-strength sputtering target for forming a protective film for an optical recording medium, obtained by sintering a mixed powder containing, in mol %, 10 to 70% of a zirconium oxide or hafnium oxide and 50% or less (over 0%) of silicon dioxide, and 0.1 to 8.4% of yttrium oxide as necessary, and the remainder containing aluminum oxide, lanthanum oxide, or indium oxide and inevitable impurities, wherein a complex oxide phase of $Al_6Si_2O_{13}$, $La_2SiO_5$, or $In_2Si_2O_7$ is formed in a base of the target.

12 Claims, No Drawings

HIGH-STRENGTH SPUTTERING TARGET FOR FORMING PROTECTIVE FILM FOR OPTICAL RECORDING MEDIUM

CROSS-REFERENCE TO PRIOR APPLICATION

This is the U.S. National Phase Application under 35 U.S.C. §371 of International Patent Application No. PCT/JP2007/061643 filed Jun. 8, 2007, which claims the benefit of Japanese Patent Application No. 2006-159303 filed Jun. 8, 2006, both of which are incorporated by reference herein. The International Application was published in Japanese on Dec. 13, 2007 as WO2007/142333 A1 under PCT Article 21(2).

FIELD OF THE INVENTION

The present invention relates to a high-strength sputtering target (hereinafter, referred to as "target") for forming a protective film for an optical recording medium which is capable of recording, reading out, repeatedly recording and reading out, and erasing information using a laser beam.

BACKGROUND OF THE INVENTION

It is generally known that protective films (hereinafter including both lower and upper protective films) for an optical recording medium such as a laser disk or the like typically include 20% of silicon dioxide ($SiO_2$) with the remaining part being zinc sulfide (ZnS). This protective film is known to be obtained by carrying out sputtering with the use of a target for forming a protective film for an optical recording medium, i.e., a ZnS—$SiO_2$ based hot-press sinter which includes 20% silicon dioxide ($SiO_2$) with the remaining part being zinc oxide sulfide (ZnS).

However, such a protective film prepared by using a target composed of a ZnS—$SiO_2$ based hot-press sinter causes a problem in that repeatable re-recording performance deteriorates when a laser beam is irradiated to a recording layer to repetitively perform re-recording since S in ZnS of a target composed of a ZnS—$SiO_2$ based hot-press sinter diffuses in the recording layer. Consequently, development of a protective film containing no S has been carried out. Examples of a protective film containing no S, as follows, are known where values are in mol %.

(i) A protective film for an optical recording medium produced by sintering a mixed powder including 10 to 70% of zirconium oxide, and 50% or less (over 0%) of silicon dioxide, and the remainder containing aluminum oxide and inevitable impurities.

(ii) A protective film for an optical recording medium produced by sintering a mixed powder including 10 to 70% of hafnium oxide, 50% or less (over 0%) of silicon dioxide and the remainder containing aluminum oxide and inevitable impurities.

(iii) A protective film for an optical recording medium produced by sintering a mixed powder including 10 to 70% of zirconium oxide, 0.1 to 8.4% of yttrium oxide, and 50% or less (over 0%) of silicon dioxide, and the remainder containing aluminum oxide and inevitable impurities.

(iv) A protective film for an optical recording medium produced by sintering a mixed powder including 10 to 70% of zirconium oxide, and 50% or less (over 0%) of silicon dioxide, and the remainder containing lanthanum oxide and inevitable impurities.

(v) A protective film for an optical recording medium produced by sintering a mixed powder including 10 to 70% of hafnium oxide, and 50% or less (over 0%) of silicon dioxide, and the remainder containing lanthanum oxide and inevitable impurities.

(vi) A protective film for an optical recording medium produced by sintering a mixed powder including 10 to 70% of zirconium oxide, 0.1 to 8.4% of yttrium oxide, and 50% or less (over 0%) of silicon dioxide, and the remainder containing lanthanum oxide and inevitable impurities.

(vii) A protective film for an optical recording medium produced by sintering a mixed powder including 10 to 70% of zirconium oxide, and 50% or less (over 0%) of silicon dioxide, and the remainder containing indium oxide and inevitable impurities.

(viii) A protective film for an optical recording medium produced by sintering a mixed powder including 10 to 70% of hafnium oxide, and 50% or less (over 0%) of silicon dioxide, and the remainder containing indium oxide and inevitable impurities.

(ix) A protective film for an optical recording medium produced by sintering a mixed powder including 10 to 70% of zirconium oxide, 0.1 to 8.4% of yttrium oxide, and 50% or less (over 0%) of silicon dioxide, and the remainder containing indium oxide and inevitable impurities.

In addition, a target for forming protective films for an optical recording medium which have compositions described in the foregoing (i) to (ix) has been developed. This target has the same composition as the protective films for an optical recording medium mentioned in (i) to (ix) above (refer to Japanese Patent Application Laid-Open No. 2005-56545).

The target employs the oxide powders mentioned in the foregoing (i) to (ix) as a raw powder. The raw powders are mixed at a predetermined ratio and combined to prepare a mixed powder. The mixed powders are molded and baked in air or an oxidative atmosphere such as an oxygen atmosphere, thereby producing the targets.

SUMMARY OF THE INVENTION

In targets produced by mixing oxide powders prepared as in (i) to (ix) as raw powders at a predetermined ratio and combining into mixed powders, followed by molding and baking the mixed powders in an oxidative atmosphere under normal conditions, cracks occur during high-power sputtering, and thus formation of a protective group for an optical recording medium cannot be efficiently achieved.

An object of the present invention is to provide a high-strength target for forming a protective film for an optical recording medium in which cracks do not occur even in high-power sputtering.

The inventors of the present invention have carried out extensive studies to produce a high-strength target for forming a protective film for an optical recording medium without producing cracks even in high-power sputtering. As a result, the following results are obtained.

(a) As for a sputtering target for forming a protective film for an optical recording medium produced by sintering a mixed powder including 10 to 70% of zirconium oxide, and 50% or less (over 0%) of silicon dioxide, and the remainder containing aluminum oxide and inevitable impurities; a sputtering target for forming a protective film for an optical recording medium produced by sintering a mixed powder including 10 to 70% of hafnium oxide, and 50% or less (over 0%) of silicon dioxide, and the remainder containing aluminum oxide and inevitable impurities; or a sputtering target for forming a protective film for an optical recording medium produced by sintering a mixed powder containing 10 to 70% of zirconium oxide, 0.1 to 8.4% of yttrium oxide, and 50% or less (over 0%) of silicon dioxide, and the remainder containing an aluminum oxide and inevitable impurities; a target having a structure in which a complex oxide phase of $Al_6Si_2O_{13}$ is formed in a target base has further improved density and strength. Thus, cracks do not occur in the target during high-power sputtering.

(b) As for a sputtering target for forming a protective film for an optical recording medium produced by sintering a mixed powder including 10 to 70% of zirconium oxide, and 50% or less (over 0%) of silicon dioxide, and the remainder containing lanthanum oxide and inevitable impurities; a sputtering target for forming a protective film for an optical recording medium produced by sintering a mixed powder including 10 to 70% of hafnium oxide, and 50% or less (over 0%) of a silicon dioxide, and the remainder containing a lanthanum oxide and inevitable impurities; or a sputtering target for forming a protective film for an optical recording medium produced by sintering a mixed powder including 10 to 70% of zirconium oxide, 0.1 to 8.4% of yttrium oxide, and 50% or less (over 0%) of silicon dioxide, and the remainder containing a lanthanum oxide and inevitable impurities; a target having a structure in which a complex oxide phase of $La_2SiO_5$ is formed in a target base has further improved density and strength. Thus, cracks do not occur in the target during high-power sputtering.

(c) As for a sputtering target for forming a protective film for an optical recording medium produced by sintering a mixed powder including 10 to 70% of zirconium oxide, and 50% or less (over 0%) of silicon dioxide, and the remainder containing indium oxide and inevitable impurities; a sputtering target for forming a protective film for an optical recording medium produced by sintering a mixed powder including 10 to 70% of hafnium oxide, and 50% or less (over 0%) of silicon dioxide, and the remainder containing an indium oxide and inevitable impurities; or a sputtering target for forming a protective film for an optical recording medium produced by sintering a mixed powder including 10 to 70% of zirconium oxide, 0.1 to 8.4% of yttrium oxide, and 50% or less (over 0%) of silicon dioxide, and the remainder containing an indium oxide and inevitable impurities; a target having a structure in which a complex oxide phase of $In_2Si_2O_7$ is formed in a target base has further improved density and strength. Thus, cracks do not occur in the target during high-power sputtering. A target having a structure in which a complex oxide phase of $In_2Si_2O_7$ is formed in a target base gives more remarkably improved density and strength as compared to a target having no complex oxide phase of $In_2Si_2O_7$.

The present invention has been made on the basis of these study results.

(1) According to a first embodiment of the invention, there is provided a high-strength sputtering target for forming a protective film for an optical recording medium, obtained by sintering a mixed powder including, in mol %, 10 to 70% of zirconium oxide, and 50% or less (over 0%) of silicon dioxide, and the remainder containing an aluminum oxide and inevitable impurities; the target has a structure in which a complex oxide phase of $Al_6Si_2O_{13}$ is formed in a target base. More preferably, the content of the zirconium oxide is in the range of 20 to 50 mol %, and the content of the silicon dioxide is in the range of 10 to 30 mol %.

(2) According to another embodiment of the invention, there is provided a high-strength sputtering target for forming a protective film for an optical recording medium, obtained by sintering a mixed powder including, in mol %, 10 to 70% of hafnium oxide, and 50% or less (over 0%) of silicon dioxide, and the remainder containing aluminum oxide and inevitable impurities; the target has a structure in which a complex oxide phase of $Al_6Si_2O_{13}$ is formed in a target base. More preferably, the content of the hafnium oxide is in the range of 20 to 50 mol %, and the content of the silicon oxide is in the range of 10 to 30 mol %.

(3) According to another embodiment of the present invention, there is provided a high-strength sputtering target for forming a protective film for an optical recording medium, obtained by sintering a mixed powder including, in mol %, 10 to 70% of zirconium oxide, 0.1 to 8.4% of yttrium oxide, and 50% or less (over 0%) of a silicon dioxide, and the remainder containing an aluminum oxide and inevitable impurities; the target has a structure in which a complex oxide phase of $Al_6Si_2O_{13}$ is formed in a target base. More preferably, the content of the zirconium oxide is in the range of 20 to 50 mol %, and the content of the silicon oxide is in the range of 10 to 30 mol %.

(4) According to another embodiment of the present invention, there is provided a high-strength sputtering target for forming a protective film for an optical recording medium, obtained by sintering a mixed powder including, in mol %, 10 to 70% of zirconium oxide, and 50% or less (over 0%) of silicon dioxide, and the remainder containing lanthanum oxide and inevitable impurities; the target has a structure in which a complex oxide phase of $La_2SiO_5$ is formed in a target base. More preferably, the content of the zirconium oxide is in the range of 20 to 50 mol %, and the content of the silicon oxide is in the range of 10 to 30 mol %.

(5) According to another embodiment of the present invention, there is provided a high-strength sputtering target for forming a protective film for an optical recording medium, obtained by sintering a mixed powder including, in mol %, 10 to 70% of hafnium oxide, and 50% or less (over 0%) of silicon dioxide, and the remainder containing lanthanum oxide and inevitable impurities; the target has a structure in which a complex oxide phase of $La_2SiO_5$ is formed in a target base. More preferably, the content of the hafnium oxide is in the range of 20 to 50 mol %, and the content of the silicon oxide is in the range of 10 to 30 mol %.

(6) According to another embodiment of the present invention, there is provided a high-strength sputtering target for forming a protective film for an optical recording medium, obtained by sintering a mixed powder including, in mol %, 10 to 70% of zirconium oxide, 0.1 to 8.4% of yttrium oxide, and 50% or less (over 0%) of silicon dioxide, and the remainder containing lanthanum oxide and inevitable impurities, the target has a structure in which a complex oxide phase of $La_2SiO_5$ is formed in a target base. More preferably, the content of the zirconium oxide is in the range of 20 to 50 mol %, and the content of the silicon oxide is in the range of 10 to 30 mol %.

(7) According to another embodiment of the present invention, there is provided a high-strength sputtering target for forming a protective film for an optical recording medium, obtained by sintering a mixed powder including, in mol %, 10 to 70% of zirconium oxide, and 50% or less (over 0%) of silicon dioxide, and the remainder containing indium oxide and inevitable impurities; the target has a structure in which a complex oxide phase of $In_2Si_2O_7$ is formed in a target base. More preferably, the content of the zirconium oxide is in the range of 20 to 50 mol %, and the content of the silicon oxide is in the range of 10 to 30 mol %.

(8) According to another embodiment of the present invention, there is provided a high-strength sputtering target for forming a protective film for an optical recording medium, obtained by sintering a mixed powder including, in mol %, 10 to 70% of hafnium oxide, and 50% or less (over 0%) of silicon dioxide, and the remainder containing indium oxide and inevitable impurities; the target has a structure in which a complex oxide phase of $In_2Si_2O_7$ is formed in a target base. More preferably, the content of the hafnium oxide is in the range of 20 to 50 mol %, and the content of the silicon oxide is in the range of 10 to 30 mol %.

(9) According to another embodiment of the present invention, there is provided a high-strength sputtering target for forming a protective film for an optical recording medium, obtained by sintering a mixed powder including, in mol %, 10 to 70% of zirconium oxide, 0.1 to 8.4% of yttrium oxide, and 50% or less (over 0%) of silicon dioxide, and the remainder containing indium oxide and inevitable impurities; the target has a structure in which a complex oxide phase of $In_2Si_2O_7$ is formed in a target base. More preferably, the content of the zirconium oxide is in the range of 20 to 50 mol %, and the content of the silicon oxide is in the range of 10 to 30 mol %.

For producing a high-strength sputtering target for forming a protective film for an optical recording medium according to the present invention, zirconium oxide powder, yttira stabilized zirconia powder, hafnium oxide powder, amorphous silicon dioxide powder, aluminum oxide powder, lanthanum oxide powder, and indium oxide powder are employed as raw powders. These raw powders are combined and mixed to give compositions mentioned in (1) to (9), thereby preparing mixed powders. The mixed powders are press molded, after which the molded bodies are actively sintered at 1300° C. or higher, which is higher than the usual sintering temperature, in an oxygen atmosphere, thereby producing targets.

When producing a high-strength sputtering target for forming a protective film for an optical recording medium according to the present invention, it is crucial to use an amorphous silicon dioxide powder as the raw powder, to adopt an oxygen atmosphere, and to conduct baking at a temperature of 1300° C. or higher. If a crystalline silicon dioxide power is used, warpage occurs in the produced target, which is not preferable as the strength decreases. Furthermore, zirconium oxide powder to be used as the raw powder may be a stabilized or partially-stabilized zirconium oxide powder. As such the stabilized or partially-stabilized zirconium oxide powder, for example, there is a zirconium oxide powder containing 1 to 12 mol % of $Y_2O_3$.

A target for forming a protective film of an optical recording medium according to the invention can be made larger since the strength of the protective film is further improved. Moreover, since cracks do not form in the target even under a high-power sputtering, a protective film for an optical recording medium can be formed more efficiently.

BEST MODE FOR CARRYING OUT THE INVENTION

Hereinbelow, the target for forming a protective film for an optical recording medium according to the present invention will be described in more detail with reference to Examples.

The following powders were prepared as the raw powders: $ZrO_2$ powder having an average particle diameter of 0.2 μm and a purity of 99.99% or higher, $HfO_2$ powder having an average particle diameter of 0.2 μm and a purity of 99.99% or higher, $SiO_2$ powder having an average particle diameter of 0.2 μm and a purity of 99.99% or higher, $SiO_2$ powder having an average particle diameter of 1 μm and a purity of 99.99% or higher, $In_2O_3$ powder having an average particle diameter of 0.5 μm and a purity of 99.99% or higher, $Al_2O_3$ powder having an average particle diameter of 0.5 μm and a purity of 99.99% or higher, and $La_2O_3$ powder having an average particle diameter of 0.5 μm and a purity of 99.99% or higher. In addition, a stabilized $ZrO_2$ powder containing 3 mol % of $Y_2O_3$ was also prepared.

Example 1

The $ZrO_2$ powder, amorphous $SiO_2$ powder, crystalline $SiO_2$ powder, and $Al_2O_3$ powder were weighed to give the composition shown in Table 1 and uniformly mixed by a Henschel mixer. Subsequently, the mixed powder was press-molded, after which the obtained molded body was baked under the conditions given in Table 1, thereby producing an inventive target 1 and a conventional target 1, both of which had a diameter of 200 mm and a thickness of 6 mm and included 30% of $ZrO_2$, and 20% of $SiO_2$, and the remainders containing $Al_2O_3$. The cross sections of the target 1 of the present invention and the conventional target 1 were polished and observed through X-ray diffraction and an EPMA to determine whether or not a complex oxide phase of $Al_6Si_2O_{13}$ was formed in the bases of the targets. The results of which are given in Table 1. Furthermore, the density and flexural strength of the target 1 of the present invention and the conventional target 1 were measured. The results are shown in Table 1.

Then, the produced target 1 of the present invention and the produced conventional target 1 were mounted in a direct current magnetron sputtering system, in a state of being soldered with a water-cooled backing plate made of oxygen-free copper. First, the inside of the system was evacuated to be $1\times10^{-6}$ Torr or less using a vacuum air exhauster. Then, an Ar gas was introduced into the system so as to give a pressure of sputtering gas of $1.5\times10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on a surface of the polycarbonate substrate, using the target 1 of the present invention and the conventional target 1, respectively. Here, observation to determine whether or not cracks are formed in the targets was made. The results of which are shown in Table 1.

TABLE 1

| Target | | Composition of Raw Powder (mol %) | | | | Conditions of Baking | | | Existence or Nonexistence of Complex Oxide of $Al_6Si_2O_{13}$ in Target Base | Properties of Target | | Existence or Nonexistence of Cracks during Sputtering |
|---|---|---|---|---|---|---|---|---|---|---|---|---|
| | | $ZrO_2$ | Amorphous $SiO_2$ | Crystalline $SiO_2$ | $Al_2O_3$ | Atmosphere | Temperature (°C.) | Keeping Time (h) | | Density (%) | Flexural Strength (MPa) | |
| Present Invention | 1 | 30 | 20 | — | remainder | oxygen | 1400 | 7 | Existent | 96 | 275 | Nonexistent |
| Conventional Invention | 1 | 30 | — | 20 | remainder | air | 1200 | 7 | Nonexistent | 85 | 150 | Existent |

The results given in Table 1 show that the target 1 of the present invention in which the complex oxide phase of $Al_6Si_2O_{13}$ was formed in the base has a higher density and strength and does not give cracks upon sputtering as compared to the conventional target 1 in which the complex oxide phase of $Al_6Si_2O_{13}$ was not formed in the base, even if both had the same composition.

Example 2

The $HfO_2$ powder, amorphous $SiO_2$ powder, crystalline $SiO_2$ powder, and $Al_2O_3$ powder were weighed to give the composition shown in Table 2 and uniformly mixed by a Henschel mixer. Subsequently, the mixed powder was press-molded, after which the obtained molded body was baked under the conditions given in Table 2, thereby producing an inventive target 2 and a conventional target 2, both of which had a diameter of 200 mm and a thickness of 6 mm and included 30% of $HfO_2$, and 20% of $SiO_2$, and the remainders containing $Al_2O_3$. The cross sections of the target 2 of the present invention and the conventional target 2 were polished and observed through X-ray diffraction and an electron probe micro analyzer (EPMA) to determine whether or not a complex oxide phase of $Al_6Si_2O_{13}$ was formed in the bases of the targets, the results of which are given in Table 2. Furthermore, the density and flexural strength of the target 2 of the present invention and the conventional target 2 were measured. The results are shown in Table 2.

Then, the produced target 2 of the present invention and the produced conventional target 2 were mounted in a direct current magnetron sputtering system, in a state of being soldered with a water-cooled backing plate made of oxygen-free copper. First, the inside of the system was evacuated to be $1 \times 10^{-6}$ Torr or less using a vacuum air exhauster. Then, an Ar gas was introduced into the system so as to give a pressure of sputtering gas of $1.5 \times 10^{-3}$ Torr. A polycarbonate substrate with a thickness of 0.6 mm was disposed at an interval of 70 mm, i.e., the interval of the targets. In this state, direct current power, i.e., a sputtering power of 7 kW which was higher than norm, was applied, and protective films for an optical recording medium, having a thickness of 50 nm, were formed on a surface of the polycarbonate substrate, using the target 2 of the invention and the conventional target 2, respectively. Here, observation to determine whether or not cracks are formed in the targets was made. The results of which are shown in Table 2.

TABLE 2

| Target | | Composition of Raw Powder (mol %) | | | | Conditions of Baking | | | Existence or Nonexistence of Complex Oxide of $Al_6Si_2O_{13}$ in Target Base | Properties of Target | | Existence or Nonexistence of Cracks during Sputtering |
|---|---|---|---|---|---|---|---|---|---|---|---|---|
| | | $HfO_2$ | Amorphous $SiO_2$ | Crystalline $SiO_2$ | $Al_2O_3$ | Atmosphere | Temperature (°C.) | Keeping Time (h) | | Density (%) | Flexural Strength (MPa) | |
| Present Invention | 2 | 30 | 20 | — | Remainder | oxygen | 1400 | 7 | Existent | 97 | 220 | Nonexistent |
| Conventional Invention | 2 | 30 | — | 20 | Remainder | air | 1200 | 7 | Nonexistent | 85 | 145 | Existent |

The results given in Table 2 show that the target 2 of the present invention in which the complex oxide phase of $Al_6Si_2O_{13}$ was formed in the base has a higher density and strength and does not give cracks upon sputtering as compared to the conventional target 2 in which the complex oxide phase of $Al_6Si_2O_{13}$ was not formed in the base, even if both had the same composition.

Example 3

The stabilizer $ZrO_2$ powder containing 3 mol % of $Y_2O_3$, amorphous $SiO_2$ powder, crystalline $SiO_2$ powder, and $Al_2O_3$ powder were weighed to give the composition given in Table 3 and uniformly mixed by a Henschel mixer. Subsequently, the mixed powder was press-molded, after which the obtained molded body was baked under the conditions given in Table 3, thereby producing a target 3 of the present invention and a conventional target 3, both of which had a diameter of 200 mm and a thickness of 6 mm and included 30% of $ZrO_2$, and 0.9% of $Y_2O_3$, 20% of $SiO_2$, and the remainders containing $Al_2O_3$. The cross sections of the target 3 of the present invention and the conventional target 3 were polished and observed through X-ray diffraction and an electron probe micro analyzer (EPMA) to determine whether or not a complex oxide phase of $Al_6Si_2O_{13}$ was formed in the bases of the targets, the results of which are given in Table 3. Furthermore, the density and flexural strength of the target 3 of the present invention and the conventional target 3 were measured. The results are shown in Table 3.

Then, the produced target 3 of the present invention and the produced conventional target 3 were mounted in a direct current magnetron sputtering system, in a state of being soldered with a water-cooled backing plate made of oxygen-free copper. First, the inside of the system was evacuated to be $1\times10^{-6}$ Torr or less using a vacuum air exhauster. Then, an Ar gas was introduced into the system so as to give a pressure of sputtering gas of $1.5\times10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on the polycarbonate substrate, using the target 3 of the present invention and the conventional target 3, respectively. Here, observation to determine whether or not cracks are formed in the targets was made. The results of which are shown in Table 3.

The results given in Table 3 show that the target 3 of the present invention in which the complex oxide phase of $Al_6Si_2O_{13}$ was formed in the base has a higher density and strength and does not give upon sputtering as compared to the conventional target 3 in which the complex oxide phase of $Al_6Si_2O_{13}$ was not formed in the base, even if both had the same composition.

Example 4

The $ZrO_2$ powder, amorphous $SiO_2$ powder, crystalline $SiO_2$ powder, and $La_2O_3$ powder were weighed to give the composition given in Table 4 and uniformly mixed by a Henschel mixer. Subsequently, the mixed powder was press-molded, after which the obtained molded body was baked under the conditions given in Table 4, thereby producing a target 4 of the present invention and a conventional target 4, both of which had a diameter of 200 mm and a thickness of 6 mm and included 30% of $ZrO_2$, and 20% of $SiO_2$, and remainders containing $La_2O_3$. The cross sections of the target 4 of the present invention and the conventional target 4 were polished and observed through X-ray diffraction and an electron probe micro analyzer (EPMA) to determine whether or not a complex oxide phase of $La_2SiO_5$ was formed in the bases of the targets. The results of which are given in Table 4. Furthermore, the density and flexural strength of the target 4 of the present invention and the conventional target 4 were measured. The results are shown in Table 4.

Then, the produced target 4 of the present invention and the produced conventional target 4 were mounted in a direct current magnetron sputtering system, in a state of being soldered with a water-cooled backing plate made of oxygen-free copper. First, the inside of the system was evacuated to be $1\times10^{-6}$ Torr or less using a vacuum air exhauster. Then, an Ar gas was introduced into the system so as to give a pressure of sputtering gas of $1.5\times10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on a surface of the polycarbonate substrate, using the target 4 of the present invention and the conventional target 4, respectively. Here, observation to determine whether or not cracks are formed in the targets was made. The results of which are shown in Table 4.

TABLE 3

| Target | | Composition of Raw Powder (mol %) | | | | Conditions of Baking | | | Existence or Nonexistence of Complex Oxide of $Al_6Si_2O_{13}$ in Target Base | Properties of Target | | |
|---|---|---|---|---|---|---|---|---|---|---|---|---|
| | | Stabilizer $ZrO_2$ Containing 3 mol % of $Y_2O_3$ | Amorphous $SiO_2$ | Crystalline $SiO_2$ | $Al_2O_3$ | Atmosphere | Temperature (°C.) | Keeping Time (h) | | Density (%) | Flexural Strength (MPa) | Existence or Nonexistence of Cracks during Sputtering |
| Present Invention | 3 | 30 | 20 | — | Remainder | oxygen | 1400 | 7 | Existent | 99 | 280 | Nonexistent |
| Conventional Invention | 3 | 30 | — | 20 | Remainder | air | 1200 | 7 | Nonexistent | 92 | 200 | Existent |

TABLE 4

| Target | | Composition of Raw Powder (mol %) | | | | Conditions of Baking | | Existence or Nonexistence of Complex Oxide of $La_3SiO_5$ in Target Base | Properties of Target | | |
|---|---|---|---|---|---|---|---|---|---|---|---|
| | | $ZrO_2$ | Amorphous $SiO_2$ | Crystalline $SiO_2$ | $La_2O_3$ | Atmosphere | Temperature (° C.) | Keeping Time (h) | | Density (%) | Flexural Strength (MPa) | Existence or Nonexistence of Cracks during Sputtering |
| Present Invention | 4 | 30 | 20 | — | Remainder | oxygen | 1400 | 7 | Existent | 95 | 190 | Nonexistent |
| Conventional Invention | 4 | 30 | — | 20 | Remainder | air | 1200 | 7 | Nonexistent | 85 | 110 | Existent |

The results given in Table 4 show that the target 4 of the present invention in which the complex oxide phase of $La_2SiO_5$ was formed in the base has a higher density and strength and does not give cracks upon sputtering as compared to the conventional target 4 in which the complex oxide phase of $La_2SiO_5$ was not formed in the base, even if both had the same composition.

Example 5

The $HfO_2$ powder, amorphous $SiO_2$ powder, crystalline $SiO_2$ powder, and $La_2O_3$ powder were weighed to give the composition given in Table 5 and uniformly mixed by a Henschel mixer. Subsequently, the mixed powder was press-molded, after which the obtained molded body was baked under the conditions given in Table 5, thereby producing a target 5 of the present invention and a conventional target 5, both of which had a diameter of 200 mm and a thickness of 6 mm and included 30% of $HfO_2$, and 20% of $SiO_2$, and the remainders containing $La_2O_3$. The cross sections of the target 5 of the present invention and the conventional target 5 were polished and observed through X-ray diffraction and an electron probe micro analyzer (EPMA) to determine whether or not a complex oxide phase of $La_2SiO_5$ was formed in the bases of the targets. The results of which are given in Table 5. Furthermore, the density and flexural strength of the target 5 of the present invention and the conventional target 5 were measured. The results of which are shown in Table 5.

Then, the produced target 5 of the present invention and the produced conventional target 5 were mounted in a direct current magnetron sputtering system, in a state of being soldered with a water-cooled backing plate made of oxygen-free copper. First, the inside of the system was evacuated to be $1\times10^{-6}$ Torr or less using a vacuum air exhauster. Then, an Ar gas was introduced into the system so as to give a pressure of sputtering gas of $1.5\times10^{-3}$ Torr. A polycarbonate substrate with a thickness of 0.6 mm was disposed at an interval of 70 mm, i.e., the interval of the targets. In this state, a direct current power, i.e., a sputtering power of 7 kW which was higher than the norm, was applied, and protective films for an optical recording medium, having a thickness of 50 nm, were formed on a surface of the polycarbonate substrate, using the target 5 of the present invention and the conventional target 5, respectively. Here, observation to determine whether or not cracks are formed in the targets was made. The results of which are shown in Table 5.

TABLE 5

| Target | | Composition of Raw Powder (mol %) | | | | Conditions of Baking | | Existence or Nonexistence of Complex Oxide of $La_3SiO_5$ in Target Base | Properties of Target | | |
|---|---|---|---|---|---|---|---|---|---|---|---|
| | | $HfO_2$ | Amorphous $SiO_2$ | Crystalline $SiO_2$ | $La_2O_3$ | Atmosphere | Temperature (° C.) | Keeping Time (h) | | Density (%) | Flexural Strength (MPa) | Existence or Nonexistence of Cracks during Sputtering |
| Present Invention | 5 | 30 | 20 | — | Remainder | oxygen | 1400 | 7 | Existent | 98 | 180 | Nonexistent |
| Conventional Invention | 5 | 30 | — | 20 | Remainder | air | 1200 | 7 | Nonexistent | 85 | 100 | Existent |

The results given in Table 5 show that the target 5 of the present invention in which the complex oxide phase of $La_2SiO_5$ was formed in the base has a higher density and strength and does not give cracks upon sputtering as compared to the conventional target 5 in which the complex oxide phase of $La_2SiO_5$ was not formed in the base, even if both had the same composition.

Example 6

The stabilizer $ZrO_2$ powder containing 3 mol % of $Y_2O_3$, amorphous $SiO_2$ powder, crystalline $SiO_2$ powder, and $La_2O_3$ powder were weighed to give the composition shown in Table 6 and uniformly mixed by a Henschel mixer. Subsequently, the mixed powder was press-molded, after which the obtained molded body was baked under the condition given in Table 6, thereby producing a target 6 of the present invention and a conventional target 6, both of which had a diameter of 200 mm and a thickness of 6 mm and included 30% of $ZrO_2$, and 0.9% of $Y_2O_3$, 20% of $SiO_2$ and the remainders containing $La_2O_3$. The cross sections of the target 6 of the present invention and the conventional target 6 were polished and observed through X-ray diffraction and an electron probe micro analyzer (EPMA) to determine whether or not a complex oxide phase of $La_2SiO_5$ was formed in the bases of the targets. The results of which are given in Table 6. Furthermore, the density and flexural strength of the target 6 of the present invention and the conventional target 6 were measured. The results are shown in Table 6.

Then, the produced target 6 of the present invention and the produced conventional target 6 were mounted in a direct current magnetron sputtering system, in a state of being soldered with a water-cooled backing plate made of oxygen-free copper. First, the inside of the system was evacuated to be $1 \times 10^{-6}$ Torr or less using a vacuum air exhauster. Then, an Ar gas was introduced into the system so as to give a pressure of sputtering gas of $1.5 \times 10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on a surface of the polycarbonate substrate, using the target 6 of the present invention and the conventional target 6, respectively. Here, observation to determine whether or not cracks are formed in the targets was made. The results of which are shown in Table 6.

The results given in Table 6 show that the target 6 of the present invention in which the complex oxide phase of $La_2SiO_5$ was formed in the base has a higher density and strength and does not give cracks upon sputtering as compared to the conventional target 6 in which the complex oxide phase of $La_2SiO_5$ was not formed in the base, even if both had the same composition.

Example 7

The $ZrO_2$ powder, amorphous $SiO_2$ powder, crystalline $SiO_2$ powder, and $In_2O_3$ powder were weighed to give the composition shown in Table 7 and uniformly mixed by a Henschel mixer. Subsequently, the mixed powder was press-molded, after which the obtained molded body was baked under the condition given in Table 7, thereby producing a target 7 of the present invention and a conventional target 7, both of which had a diameter of 200 mm and a thickness of 6 mm and included 30% of $ZrO_2$, and 20% of $SiO_2$, and the remainders containing $In_2O_3$. The cross sections of the target 7 of the present invention and the conventional target 7 were polished and observed through X-ray diffraction and an electron probe micro analyzer (EPMA) to determine whether or not a complex oxide phase of $In_2Si_2O_7$ was formed in the bases of the targets. The results of which are given in Table 7. Furthermore, the density and flexural strength of the target 7 of the present invention and the conventional target 7 were measured. The results of which are shown in Table 7.

Then, the produced target 7 of the present invention and the produced conventional target 7 were mounted in a direct current magnetron sputtering system, in a state of being soldered with a water-cooled backing plate made of oxygen-free copper. First, the inside of the system was evacuated to be $1 \times 10^{-6}$ Torr or less using a vacuum air exhauster. Then, an Ar gas was introduced into the system so as to give a pressure of sputtering gas of $1.5 \times 10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on a surface of the polycarbonate substrate, using the target 7 of the present invention and the conventional target 7, respectively. Here, observation to determine whether or not cracks are formed in the targets was made. The results of which are shown in Table 7.

TABLE 6

| Target | | Composition of Raw Powder (mol %) | | | | Conditions of Baking | | Existence or Nonexistence of Complex Oxide of $La_3SiO_5$ in Target Base | Properties of Target | | |
|---|---|---|---|---|---|---|---|---|---|---|---|
| | | Stabilizer $ZrO_2$ Containing 3 mol % of $Y_2O_3$, | Amorphous $SiO_2$ | Crystalline $SiO_2$ | $La_2O_3$ | Atmosphere | Temperature (° C.) | Keeping Time (h) | | Density (%) | Flexural Strength (MPa) | Existence or Nonexistence of Cracks during Sputtering |
| Present Invention | 6 | 30 | 20 | — | Remainder | oxygen | 1400 | 7 | Existent | 96 | 220 | Nonexistent |
| Conventional Invention | 6 | 30 | — | 20 | Remainder | air | 1200 | 7 | Nonexistent | 89 | 145 | Existent |

TABLE 7

| Target | | Composition of Raw Powder (mol %) | | | | Conditions of Baking | | Existence or Nonexistence of Complex Oxide of In$_2$Si$_2$O$_7$ in Target Base | Properties of Target | | |
|---|---|---|---|---|---|---|---|---|---|---|---|
| | | ZrO$_2$ | Amorphous SiO$_2$ | Crystalline SiO$_2$ | In$_2$O$_3$ | Atmosphere | Temperature (° C.) | Keeping Time (h) | | Density (%) | Flexural Strength (MPa) | Existence or Nonexistence of Cracks during Sputtering |
| Present Invention | 7 | 30 | 20 | — | Remainder | oxygen | 1400 | 7 | Existent | 99 | 255 | Nonexistent |
| Conventional Invention | 7 | 30 | — | 20 | Remainder | air | 1200 | 7 | Nonexistent | 90 | 150 | Existent |

The results given in Table 7 show that the target 7 of the present invention in which the complex oxide phase of In$_2$Si$_2$O$_7$ was formed in the base has a higher density and strength and does not give cracks upon sputtering as compared to the conventional target 7 in which the complex oxide phase of In$_2$Si$_2$O$_7$ was not formed in the base, even if both had the same composition.

Example 8

The HfO$_2$ powder, amorphous SiO$_2$ powder, crystalline SiO$_2$ powder, and In$_2$O$_3$ powder were weighed to give the composition shown in Table 8 and uniformly mixed by a Henschel mixer. Subsequently, the mixed powder was press-molded, after which the obtained molded body was baked under the conditions given in Table 8, thereby producing a target 8 of the present invention and a conventional target 8, both of which had a diameter of 200 mm and a thickness of 6 mm and included 30% of HfO$_2$, and 20% of SiO$_2$, and the remainders containing In$_2$O$_3$. The cross sections of the target 8 of the present invention and the conventional target 8 were polished and observed through X-ray diffraction and an electron probe micro analyzer (EPMA) to determine whether or not a complex oxide phase of In$_2$Si$_2$O$_7$ was formed in the bases of the target. The results of which are given in Table 8. Furthermore, the density and flexural strength of the target 8 of the present invention and the conventional target 8 were measured. The results are shown in Table 8.

Then, the produced target 8 of the present invention and the produced conventional target 8 were mounted in a direct current magnetron sputtering system, in a state of being soldered with a water-cooled backing plate made of oxygen-free copper. First, the inside of the system was evacuated to be 1×10$^{-6}$ Torr or less using a vacuum air exhauster. Then, an Ar gas was introduced into the system so as to give a pressure of sputtering gas of 1.5×10$^{-3}$ Torr. A polycarbonate substrate with a thickness of 0.6 mm was disposed at an interval of 70 mm, i.e., the interval of the targets. In this state, a direct current power, i.e., a sputtering power of 7 kW which was higher than the norm, was applied, and protective films for an optical recording medium, having a thickness of 50 nm, were formed on a surface of the polycarbonate substrate, using the target 8 of the present invention and the conventional target 8, respectively. Here, observation to determine whether or not cracks are formed in the targets was made. The results of which are shown in Table 8.

TABLE 8

| Target | | Composition of Raw Powder (mol %) | | | | Conditions of Baking | | Existence or Nonexistence of Complex Oxide of In$_2$Si$_2$O$_7$ in Target Base | Properties of Target | | |
|---|---|---|---|---|---|---|---|---|---|---|---|
| | | HfO$_2$ | Amorphous SiO$_2$ | Crystalline SiO$_2$ | In$_2$O$_3$ | Atmosphere | Temperature (° C.) | Keeping Time (h) | | Density (%) | Flexural Strength (MPa) | Existence or Nonexistence of Cracks during Sputtering |
| Present Invention | 8 | 30 | 20 | — | Remainder | oxygen | 1400 | 7 | Existent | 98 | 200 | Nonexistent |
| Conventional Invention | 8 | 30 | — | 20 | Remainder | air | 1200 | 7 | Nonexistent | 90 | 150 | Existent |

The results given in Table 8 show that the target 8 of the present invention in which the complex oxide phase of $In_2Si_2O_7$ was formed in the base has a higher density and strength and does not give cracks upon sputtering as compared to the conventional target 8 in which the complex oxide phase of $In_2Si_2O_7$ was not formed in the base, even if both had the same composition.

Example 9

The stabilizer $ZrO_2$ powder containing 3 mol % of $Y_2O_3$, amorphous $SiO_2$ powder, crystalline $SiO_2$ powder, and $In_2O_3$ powder were weighed to give the composition shown in Table 9 and uniformly mixed by a Henschel mixer. Subsequently, the mixed powder was press-molded, after which the obtained molded body was baked under the condition given in Table 9, thereby producing a target 9 of the present invention and a conventional target 9, both of which had a diameter of 200 mm and a thickness of 6 mm and included 30% of $ZrO_2$, 0.9% of $Y_2O_3$, and 20% of $SiO_2$ and the remainders containing $In_2O_3$. The cross sections of the target 9 of the present invention and the conventional target 9 were polished and observed through X-ray diffraction and an electron probe micro analyzer (EPMA) to determine whether or not a complex oxide phase of $In_2Si_2O_7$ was formed in the bases of the targets. The results of which are given in Table 9. Furthermore, the density and flexural strength of the target 9 of the present invention and the conventional target 9 were measured. The results are shown in Table 9.

Then, the produced target 9 of the present invention and the produced conventional target 9 were mounted in a direct current magnetron sputtering system, in a state of being soldered with a water-cooled backing plate made of oxygen-free copper. First, the inside of the system was evacuated to be $1 \times 10^{-6}$ Torr or less using a vacuum air exhauster. Then, an Ar gas was introduced into the system so as to give a pressure of sputtering gas of $1.5 \times 10^{-3}$ Torr. A polycarbonate substrate with a thickness of 0.6 mm was disposed at an interval of 70 mm, i.e., the interval of the targets. In this state, a direct current power, i.e., a sputtering power of 9 kW which was higher than the norm, was applied, and protective films for an optical recording medium, having a thickness of 50 nm, were formed on a surface of the polycarbonate substrate, using the target 9 of the present invention and the conventional target 9, respectively. Here, observation to determine whether or not cracks are formed in the targets was made. The results of which are shown in Table 9.

pared to the conventional target 9 in which the complex oxide phase of $In_2Si_2O_7$ was not formed in the base, even if both had the same composition.

As described above, a target for forming a protective film for an optical recording medium according to the present invention can be formed in a large size due to even more improved strength. Moreover, as cracks do not form in the target even under high-power sputtering, a protective film for an optical recording medium can be formed more efficiently. Accordingly, the present invention is substantially useful for industrial applications.

The invention claimed is:

1. A high-strength sputtering target for forming a protective film for an optical recording medium, obtained by sintering a mixed powder consisting of, in mol %, 10 to 70% of zirconium oxide, and 50% or less and more than 0% of silicon dioxide including an amorphous silicon dioxide, and the remainder containing indium oxide, wherein a complex oxide phase of $In_2Si_2O_7$ is formed in a base of the target.

2. The high-strength sputtering target according to claim 1, obtained by sintering a mixed powder consisting of, in mol %, 20 to 50% of the zirconium oxide, 10 to 30% of the silicon dioxide, and the remainder is the indium oxide.

3. The high-strength sputtering target according to claim 1, the silicon dioxide is all amorphous silicon dioxide.

4. A high-strength sputtering target for forming a protective film for an optical recording medium, obtained by sintering a mixed powder consisting of, in mol %, 10 to 70% of zirconium oxide, 0.1 to 8.4% of yttrium oxide, and 50% or less and more than 0% of silicon dioxide including an amorphous silicon dioxide, and the remainder containing indium oxide, wherein a complex oxide phase of $In_2Si_2O_7$ is formed in a base of the target.

5. The high-strength sputtering target according to claim 4, obtained by sintering a mixed powder consisting of, in mol %, 20 to 50% of the zirconium oxide, 0.1 to 8.4% of the yttrium oxide, 10 to 30% of the silicon dioxide, and the remainder is the indium oxide.

6. The high-strength sputtering target according to claim 4, the silicon dioxide is all amorphous silicon dioxide.

7. A method for producing a high-strength sputtering target with a complex oxide phase of $In_2Si_2O_7$ formed in a base of the target, for a protective film for an optical recording medium comprising the steps of:

TABLE 9

| | Composition of Raw Powder (mol %) | | | | Conditions of Baking | | Existence or Nonexistence of Complex Oxide of $In_2Si_2O_7$ in Target Base | Properties of Target | | |
|---|---|---|---|---|---|---|---|---|---|---|
| | Stabilizer | | | | | | | | | Existence or Nonexistence of Cracks upon Sputtering |
| Target | $ZrO_2$ Containing 3 mol % of $Y_2O_3$, | Amorphous $SiO_2$ | Crystalline $SiO_2$ | $In_2O_3$ | Atmosphere | Temperature (°C.) | Keeping Time (h) | | Density (%) | Flexural Strength (MPa) |
| Present Invention 9 | 30 | 20 | — | Remainder | oxygen | 1400 | 7 | Existent | 99 | 255 | Nonexistent |
| Conventional Invention 9 | 30 | — | 20 | Remainder | air | 1200 | 7 | Nonexistent | 90 | 150 | Existent |

The results given in Table 9 show that the target 9 of the present invention in which the complex oxide phase of $In_2Si_2O_7$ was formed in the base has a higher density and strength and does not give cracks upon sputtering as compress molding a mixed powder consisting of, in mol %, 10 to 70% of zirconium oxide, and 50% or less and more than 0% of silicon dioxide, and the remainder containing indium oxide; and sintering said mixed powder in an oxygen atmosphere at 1300° C. or higher to form the complex oxide phase of $In_2Si_2O_7$ in the base of the target,
wherein, the silicon dioxide in the mixed powder includes an amorphous silicon dioxide.

8. The method for producing a high-strength sputtering target according to claim 7, wherein the mixed powder consists of, in mol %, 20 to 50% of the zirconium oxide, 10 to 30% of the silicon dioxide, and the remainder is the indium oxide.

9. The method for producing a high-strength sputtering target according to claim 7, the silicon dioxide is all amorphous silicon dioxide.

10. A method for producing a high-strength sputtering target with a complex oxide phase of $In_2Si_2O_7$ formed in a base of the target, for a protective film for an optical recording medium comprising the steps of:
press molding a mixed powder consisting of, in mol %, 10 to 70% of zirconium oxide, 0.1 to 8.4% of yttrium oxide, and 50% or less and more than 0% of silicon dioxide, and the remainder containing indium oxide; and
sintering said mixed powder in an oxygen atmosphere at 1300° C. or higher to form the complex oxide phase of $In_2Si_7O_7$ in the base of the target,
wherein, the silicon dioxide in the mixed powder includes an amorphous silicon dioxide.

11. The method for producing a high-strength sputtering target according to claim 10, wherein the mixed powder consists of, in mol %, 20 to 50% of the zirconium oxide, 0.1 to 8.4% of yttrium oxide, 10 to 30% of the silicon dioxide, and the remainder is the indium oxide.

12. The method for producing a high-strength sputtering target according to claim 10, the silicon dioxide is all amorphous silicon dioxide.

* * * * *